(12) United States Patent
Yang et al.

(10) Patent No.: US 11,797,729 B2
(45) Date of Patent: Oct. 24, 2023

(54) HYPER-CONVERGED INFRASTRUCTURE (HCI) OPERATION PREDICTOR

(71) Applicant: VMware, Inc., Palo Alto, CA (US)

(72) Inventors: Yi Yang, San Jose, CA (US); Mansi Shah, San Jose, CA (US); Vishnu Rajula, Sunnyvale, CA (US); Ojan Thornycroft, Los Altos, CA (US)

(73) Assignee: VMware, Inc., Palo Alto, CA (US)

( * ) Notice: Subject to any disclaimer, the term of this patent is extended or adjusted under 35 U.S.C. 154(b) by 789 days.

(21) Appl. No.: 16/446,146

(22) Filed: Jun. 19, 2019

(65) Prior Publication Data

US 2020/0401671 A1    Dec. 24, 2020

(51) Int. Cl.
  *G06F 12/00*    (2006.01)
  *G06F 13/00*    (2006.01)
  *G06F 30/20*    (2020.01)
  *G06F 3/06*    (2006.01)
  *G06F 16/27*    (2019.01)

(52) U.S. Cl.
  CPC ............ *G06F 30/20* (2020.01); *G06F 3/0604* (2013.01); *G06F 3/0653* (2013.01); *G06F 3/0673* (2013.01); *G06F 16/27* (2019.01)

(58) Field of Classification Search
  CPC .... G06F 3/0604; G06F 3/0653; G06F 3/0673; G06F 30/20; G06F 16/27
  USPC ......................................................... 711/154
  See application file for complete search history.

(56) References Cited

U.S. PATENT DOCUMENTS

| | | | | |
|---|---|---|---|---|
| 5,121,492 A | * | 6/1992 | Saville, III | G06F 3/0601 714/E11.167 |
| 5,787,153 A | * | 7/1998 | Bankay | H04Q 3/54516 379/133 |
| 7,401,015 B1 | * | 7/2008 | Bailey | G06F 30/33 716/136 |
| 7,680,997 B1 | * | 3/2010 | Specht | G06F 11/26 714/6.13 |
| 8,560,284 B2 | * | 10/2013 | Park | G06Q 10/08 703/6 |
| 8,593,918 B1 | * | 11/2013 | Lecrone | G06F 3/0619 369/30.01 |
| 8,601,209 B1 | * | 12/2013 | LeCrone | G06F 11/2094 711/111 |
| 8,862,541 B1 | * | 10/2014 | Cox | G06F 11/1435 707/613 |
| 9,507,887 B1 | * | 11/2016 | Wang | G06F 3/0647 |
| 9,645,766 B1 | * | 5/2017 | LeCrone | G06F 3/0686 |
| 9,727,432 B1 | * | 8/2017 | Cutforth | G06F 11/0727 |
| 10,440,153 B1 | * | 10/2019 | Smith | H04L 67/34 |

(Continued)

*Primary Examiner* — Sheng Jen Tsai

(57) ABSTRACT

Techniques for predicting the outcome of a storage management operation on a hyper-converged infrastructure (HCI) deployment are provided. In one set of embodiments, a computer system can retrieve a current storage resource state of the HCI deployment. The computer system can then execute a simulation of the storage management operation in view of the current storage resource state, where the executing includes performing one or more simulated data movements between one or more host systems in the HCI deployment. Upon completing the simulation, the computer system can generate a report including, among other things, a predicted result status of the storage management operation based on the simulation.

21 Claims, 5 Drawing Sheets

(56) References Cited

U.S. PATENT DOCUMENTS

| | | | | |
|---|---|---|---|---|
| 2003/0191615 | A1* | 10/2003 | Bailey | G06F 30/33 703/13 |
| 2005/0195660 | A1* | 9/2005 | Kavuri | G06F 3/0664 365/189.05 |
| 2007/0203768 | A1* | 8/2007 | Adra | G08B 13/14 340/572.1 |
| 2009/0276203 | A1* | 11/2009 | Everhart | G06F 11/3457 703/21 |
| 2009/0281783 | A1* | 11/2009 | Bitar | G06F 11/3457 703/21 |
| 2010/0076740 | A1* | 3/2010 | Kuchuk | E21B 49/087 703/10 |
| 2010/0225447 | A1* | 9/2010 | Adra | G01S 5/0294 340/10.1 |
| 2011/0191029 | A1* | 8/2011 | Jalali | E21B 49/087 702/6 |
| 2015/0022917 | A1* | 1/2015 | Ashida | G06F 3/0686 360/51 |
| 2015/0135008 | A1* | 5/2015 | Lucas | G06F 11/2017 714/14 |
| 2017/0060633 | A1* | 3/2017 | Suarez Gracia | G06F 11/3433 |
| 2017/0353531 | A1* | 12/2017 | Conn | G06F 11/34 |
| 2018/0145955 | A1* | 5/2018 | Nirwal | H04L 9/0894 |
| 2019/0026290 | A1* | 1/2019 | Huang | G06F 16/00 |
| 2019/0102085 | A1* | 4/2019 | Yang | G06F 3/061 |
| 2019/0122761 | A1* | 4/2019 | Goertier | G16H 40/40 |
| 2019/0317670 | A1* | 10/2019 | Weiss | G06F 3/0649 |
| 2019/0347047 | A1* | 11/2019 | Khandare | G06F 3/0659 |
| 2019/0372835 | A1* | 12/2019 | Featonby | H04L 67/1095 |
| 2019/0372908 | A1* | 12/2019 | Featonby | H04L 41/40 |
| 2020/0099773 | A1* | 3/2020 | Myers | H04L 67/34 |
| 2020/0183720 | A1* | 6/2020 | Dai | G06F 3/0665 |

* cited by examiner

HYPER-CONVERGED INFRASTRUCTURE (HCI) OPERATION PREDICTOR

BACKGROUND

In a hyper-converged infrastructure (HCI) deployment, it is often necessary to perform storage management operations that involve moving large amounts of data between the disks/host systems of the deployment. Examples of such storage management operations include placing a host system into maintenance mode (which migrates all of the data stored on the local disks of that host system to other hosts), disk format conversion, storage policy changes, and so on. Due to the degree of data movement involved, these types of storage management operations typically take a long time to complete (e.g., on the order of hours or days).

If an HCI deployment has insufficient storage resources to accommodate all of the data movement required by a given storage management operation, the operation will fail while in-flight, potentially multiple hours or days after it was initiated. This is undesirable because the compute cycles, I/O bandwidth, and time consumed to execute the storage management operation up to the point of failure will have been wasted.

In addition, when a storage management operation fails due to insufficient storage resources, the user that initiated the operation will generally have no idea of what kind of storage resource, and how much of that resource, should be added to the deployment in order for the operation to succeed. Thus, the user cannot take appropriate steps to address the deficiency and successfully re-run the operation.

DETAILED DESCRIPTION

Figure 1:
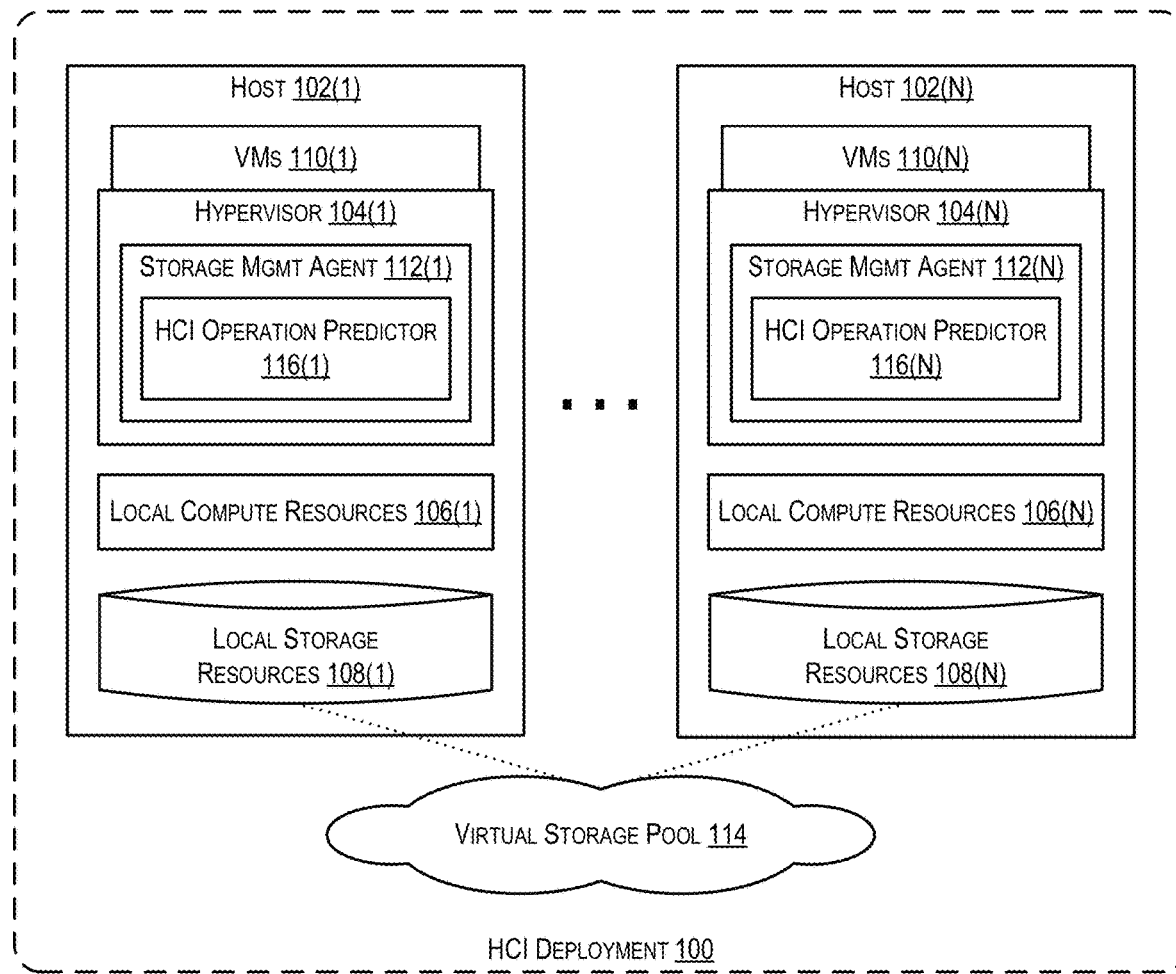
FIG. 1 depicts an example HCI deployment that implements the techniques of the present disclosure according to certain embodiments.

In the following description, for purposes of explanation, numerous examples and details are set forth in order to provide an understanding of various embodiments. It will be evident, however, to one skilled in the art that certain embodiments can be practiced without some of these details, or can be practiced with modifications or equivalents thereof.

1. Overview

Embodiments of the present disclosure are directed to a mechanism, referred to herein as an "HCI operation predictor," that can predict the outcome of a storage management operation in an HCI deployment, without actually executing the operation. As used herein, an "HCI deployment" is a deployment of physical servers (i.e., host systems) where both the compute and storage resources of the physical servers are virtualized at the hypervisor level.

In one set of embodiments, the HCI operation predictor can receive information regarding the deployment's current storage resource state (e.g., number of host systems, number of disks per host system, usage and capacity of each disk, number of objects, usage and capacity of each object, component layout and storage policies of each object, etc.) and can run an in-memory simulation of the storage management operation based on this information. The in-memory simulation can include a simulation of all of the data movements required by the storage management operation. The HCI operation predictor can then generate a report indicating, among other things, whether the storage management operation will be successful. Based on this report, a user can determine whether to move forward with actually running the storage management operation on the deployment.

In certain embodiments, in addition to operation result status, the report can include a final storage resource state of the deployment upon operation completion and a comparison of this final storage resource state with the deployment's initial (i.e., pre-operation) storage resource state. This allows the user to quickly and easily understand the effects of the storage management operation on the deployment. Further, if the HCI operation predictor determines that the storage management operation will fail due to the lack of certain storage resources, the report can indicate exactly what resources, and how much of those resources, are needed. With this information, the user can add the appropriate storage resources to the deployment and thereby ensure that the storage management operation will complete successfully when actually run.

In further embodiments, the generated report (or a portion thereof, such as the operation result status) may be fed into a downstream component/engine that can automatically trigger one or more actions based on that information. These actions can include, e.g., initiating or scheduling the storage management operation, signaling an alert or escalation, or taking steps to add one or more storage resources to the deployment.

The foregoing and other aspects of the present disclosure are described in further detail in the sections that follow.

2. Example HCI Deployment

FIG. 1 is a simplified block diagram of an HCI deployment 100 that implements the techniques of the present disclosure according to certain embodiments. As shown, HCI deployment 100 includes a cluster of host systems 102(1)-(N), each of which comprises a hypervisor 104, a set of local compute resources 106 (e.g., central processing units (CPUs)), and a set of local storage resources 108 (e.g., directly-attached solid state disks (SSDs), spinning hard disks, non-volatile memory (NVM), etc.). Hypervisors 104(1)-(N) are configured to virtualize the local compute resources of their respective host systems and allocate the virtualized compute resources to locally-running virtual machines (VMs) 110(1)-(N). In addition, storage management agents 112(1)-(N) residing within hypervisors 104(1)-(N) are configured to aggregate the local storage resources of their respective host systems into a virtual storage pool 114 and make virtual storage pool 114 available to VMs 110(1)-(N) for data storage purposes. In a particular embodiment, each hypervisor 104 can be an instance of the ESXi hypervisor developed by VMware, Inc. and each storage management agent 112 can be a VMware vSAN (virtual SAN) agent.

Figure 2:
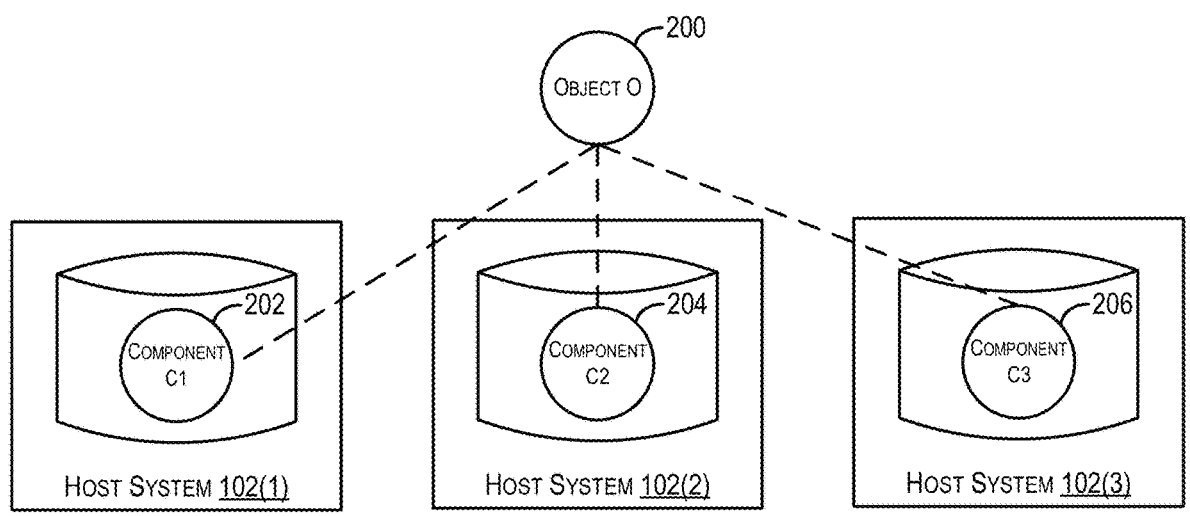
FIG. 2 depicts an example object and its constituent components according to certain embodiments.

Generally speaking, storage management agents 112(1)-(N) manage the storage of data within virtual storage pool 114 (and thus, across local storage resources 108(1)-(N)) in the form of data containers known as objects. Each object, in turn, is composed of one or more components, which can be understood as sub-objects that contain some portion of the data and/or metadata of its parent object. For instance, FIG. 2 depicts an example object O (reference numeral 200) which may correspond to, e.g., a VM file or any other type of file maintained by HCI deployment 100. Object O is composed of three components C1 (reference numeral 202), C2 (reference numeral 204), and C3 (reference numeral 206) that are stored on the local storage resources of host systems 102(1), 102(2), and 102(3) respectively.

Objects can be associated with storage policies that define certain requirements regarding the object's characteristics/structure and how the components of the object may be stored/distributed across the deployment. For example, object 200 of FIG. 2 may be associated with a storage policy indicating that each component 202/204/206 of the object must be stored on a different host system (or in other words, fault domain) of the deployment for fault tolerance/high availability purposes. These storage policies can be defined on a per-object basis or with respect to object "owners" (e.g., VMs). In the latter case, the storage policies defined for a given owner can be automatically applied to all objects owned/created by that entity.

As noted in the Background section, it is often necessary to perform movement-intensive storage management operations—in other words, storage management operations that involve large-scale data movements between disks/hosts—in HCI deployments like deployment 100 of FIG. 1 for various reasons. For example, consider a scenario where an administrator of HCI deployment 100 wishes to take host system 102(1) offline for maintenance. In this scenario, the administrator will typically run a storage management operation that evacuates all of the objects/components stored on local storage resources (e.g., local disks) 108(1) of host system 102(1) to other host systems of HCI deployment 100. This ensures that those objects/components will remain fully accessible and compliant with their respective storage policies while host system 102(1) is down.

However, a significant complication with the foregoing is that, if there are not enough storage resources in HCI deployment 100 to accommodate all of host system 102(1)'s objects/components, the storage management operation will fail once the deployment's available resources are exhausted. This failure may occur hours, or even days, after the operation was started, which means that the compute power and I/O bandwidth dedicated to running the operation during that extended time period will have been effectively wasted. Further, at the time of the failure, the administrator will generally be in the dark as to why the operation failed and how it can be successfully resolved, resulting in a frustrating user experience.

In some existing HCI implementations, it is possible to perform a storage resource "pre-check" prior to executing a storage management operation that, for example, looks at the storage usage of a host system or disk to be removed from a deployment and compares that number with an aggregate amount of free storage space in the deployment. If the storage usage of the host/disk to be removed is less than the aggregate free storage capacity, the operation is allowed to proceed. However, because this pre-check is a simple capacity comparison, it fails to take into account all of the complex rules that govern data movement during actual operation execution (including requirements imposed by object-level storage policies), and thus fails to serve as an accurate predictor of whether or not the storage management operation will be successful.

To address the foregoing and other issues, each hypervisor 104 of FIG. 1 is enhanced to include a novel HCI operation predictor 116 in accordance with embodiments of the present disclosure. HCI operation predictor 116 is shown in FIG. 1 as being a part of storage management agent 112, but in alternative embodiments HCI operation predictor 116 can be implemented elsewhere in the software stack of hypervisor 104, or potentially on a remote machine (such as, e.g., a cluster management server).

At a high level, HCI operation predictor 116 can simulate, in memory (e.g., in host system RAM), the execution of a given storage management operation on HCI deployment 100 based on the deployment's current storage resource state. This current storage resource state information can include, for example, the current number of host systems, the current number of disks per host system, the current usage and capacity of each disk, the current number of objects, the current usage and capacity of each object, the current component layout and storage policies of each object, and so on. As part of the simulation, HCI operation predictor 116 can simulate the exact (or substantially similar) data movements across disks/hosts that would have been performed if the operation were actually run on the deployment.

Once the simulation is complete, HCI operation predictor 116 can generate a report indicating the outcome of the simulation. In one set of embodiments, this report can include a predicted result of the storage management operation (e.g., success, failure, or failure due to lack of certain resources). In a further set of embodiments, the report can include post-operation storage resource state information indicating the effect of the operation on the storage resources of the deployment, as well as a comparison of that post-operation state to pre-operation state. In yet further embodiments, if the predicted result is a failure due to lack of certain storage resources, the report can include an indication of what storage resource(s), and how much of those storage resource(s), need to be added to the deployment in order to achieve a successful result. In yet further embodiments, if the storage management operation causes any objects in the deployment to become inaccessible or fall out of compliance with their respective storage policies, the report can identify those specific objects.

With the general approach described above, HCI operation predictor 116 enables users of HCI deployment 100 to accurately foresee whether a given storage management operation will be successful or not, without having to actually run the operation on the deployment. This advantageously saves the users from the frustration and wasted time/effort/system resources arising from scenarios where the operation is initiated but ends up unexpectedly failing several hours or days later. Since the simulation performed by HCI operation predictor 116 is run entirely in memory (and does not actually move any data between disks or hosts), it can be executed far more quickly than the actual operation.

In addition, because the report generated by HCI operation predictor 116 provides further useful information in various embodiments such as (1) post-operation storage resource state, (2) guidance on what storage resources should be added if the result status indicates a failure due to lack of resources, and (3) a list of objects that have become inaccessible or fallen out of policy compliance, the users of HCI deployment 100 can easily understand the effects of the operation and can take action, if needed, to ensure that the operation is successful when actually run. This significantly enhances the user experience of managing HCI deployment 100 and, in the long run, can serve to improve the adoption of HCI over alternative IT infrastructure solutions.

The remaining sections of this disclosure provide additional details regarding the implementation of HCI operation predictor 116, including a workflow of its operation and certain optimizations. It should be appreciated that HCI deployment 100 of FIG. 1 is illustrative and not intended to limit embodiments of the present disclosure. For example, although FIG. 1 depicts a particular arrangement of entities in HCI deployment 100, other arrangements or configurations are possible depending on the specific implementation. Further, the various entities shown may have subcomponents or functions that are not specifically described. One of ordinary skill in the art will recognize other variations, modifications, and alternatives.

3. Predictor Workflow

Figure 3:
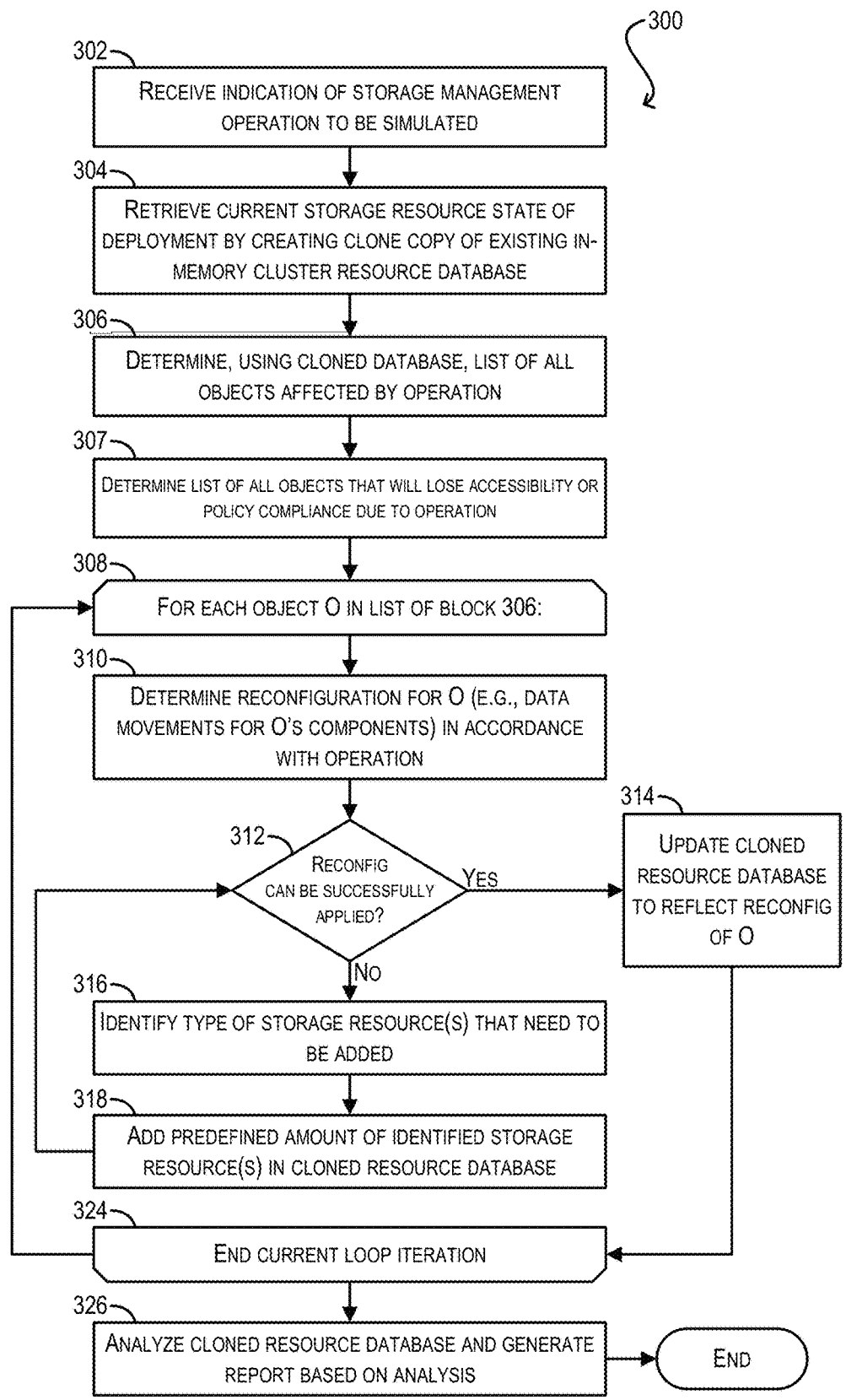
FIG. 3 depicts a workflow for predicting the outcome of a storage management operation according to an embodiment.

FIG. 3 depicts a workflow 300 that can be executed by each HCI operation predictor 116 of FIG. 1 to simulate the execution of a storage management operation on HCI deployment 100 and thereby predict the operation's outcome according to certain embodiments. Generally speaking, workflow 300 will be executed by the predictor whose respective storage management agent 112 owns (i.e., is assigned to) the objects to be moved via the operation. For example, if the storage management operation corresponds to the removal of a particular disk within host system 102(1) (which means that all of the objects stored on that disk will be evacuated to some other location), the simulation of the operation can be performed by HCI operation predictor 116(1) of host system 102(1).

Starting with block 302, HCI operation predictor 116 can be invoked and, as part of this invocation, can receive an indication of the storage management operation to be simulated. Examples of such operations include, e.g., placing a host system into maintenance mode, remove a disk or disk group from a host system, disk format conversion, implementing a storage policy change, and fixing all objects that are non-compliant with a particular storage policy.

At block 304, HCI operation predictor 116 can retrieve the current storage resource state of HCI deployment 100 by creating a clone copy of an existing cluster resource database that is maintained in the memory of the host system on which the predictor resides. This cloned resource database can include information such as the current number of host systems in HCI deployment 100, the current number of disks and disk groups per host system, the current capacity of each disk, the current usage of each disk, the current number of objects maintained in HCI deployment 100, the objects on each host/disk, the current data capacity of each object, the current data usage of each object, the current layout and status of components for each object, and the storage policies associated with each object.

Once the cloned resource database has been created in host system memory, HCI operation predictor 116 can determine, from the cloned database, a list of all objects affected by the storage management operation (block 306). In addition, HCI operation predictor 116 can determine a list of all objects that will lose accessibility and/or compliance with the storage policies as a result of the operation (block 307). HCI operation predictor 116 can then enter a loop for each object O in the list determined at block 306 (block 308).

Within the loop, HCI operation predictor 116 can first determine how object O should be "reconfigured" in accordance with the storage management operation, where "reconfiguration" refers to the act of moving the object's components from one storage location (e.g., one disk/host) to another storage location (e.g., another disk/host) (block 310). HCI operation predictor 116 can make this determination using the same (or substantially similar) rules as those employed by storage management agent 112 at the time of executing the actual operation on HCI deployment 110. In this way, HCI operation predictor 116 can precisely simulate the data movements carried out during the actual operation. For example, the object reconfiguration determined at block 310 can preserve/respect all of the storage policies associated with object O, including fault tolerance capability, the object's defined data capacity, the object's provisioning state (thick or thin), and so on.

Upon determining the appropriate reconfiguration for object O, HCI operation predictor 116 can check whether the reconfiguration can be successfully applied to the current state of the cloned resource database—in other words, whether there are sufficient storage resources defined in the database to allow the reconfiguration to occur (block 312). If so, HCI operation predictor 116 can update, in memory, the cloned resource database to reflect the data movements involved in the reconfiguration for object O (block 314). For example, if the determined reconfiguration indicates that component C1 of object O should be moved from disk D1 of host system 102(1) to disk D2 of host system 102(2), HCI operation predictor 116 can update the usage levels of disks D1 and D2 within the cloned resource database to reflect this movement. HCI operation predictor 116 can also update any other portions of the cloned resource database as necessary.

On the other hand, if the reconfiguration cannot be applied to the current state of the cloned resource database at block 312 (which indicates that one or more storage resources are deficient), HCI operation predictor 116 can identify the type of storage resource(s) that should be added in order for the reconfiguration to be successful (block 316) and can add a predefined amount of those resource(s) to the database (block 318). This act of adding an amount of a storage resource to the cloned resource database can involve updating one or more entries in the database to reflect the desired amount. HCI operation predictor 116 can then return to block 312 in order to re-check the reconfiguration for object O, and this process can continue until the reconfiguration is successful. Note that once a new resource is added per block 318, that resource will remain in the cloned resource database and can be used by subsequent object reconfigurations that are part of the same simulated operation.

At block 324, upon successfully updating the cloned resource database to reflect the object reconfiguration, the current loop iteration can end. HCI operation predictor 116 can subsequently repeat the loop until every object in the determined object list has been processed.

Finally, at block 326, HCI operation predictor 116 can analyze the cloned resource database (which should now reflect the final storage resource state of HCI deployment 100 at operation completion) and, based on that analysis, can generate a report that includes:

1. The operation result status (e.g., success, failure, or failure due to lack of certain storage resources);
2. A resource usage map that illustrates the final storage resource state of the deployment and a comparison of that final storage resource state to the deployment's pre-operation storage resource state;
3. If the result status indicates a failure due to the lack of certain storage resources, a list of the storage resources (e.g., type and amount) that were added during the simulation in order to make the operation successful; and
4. A list of object IDs for objects that lost accessibility or storage policy compliance due to the operation (as determined at block 307).

Figure 4:
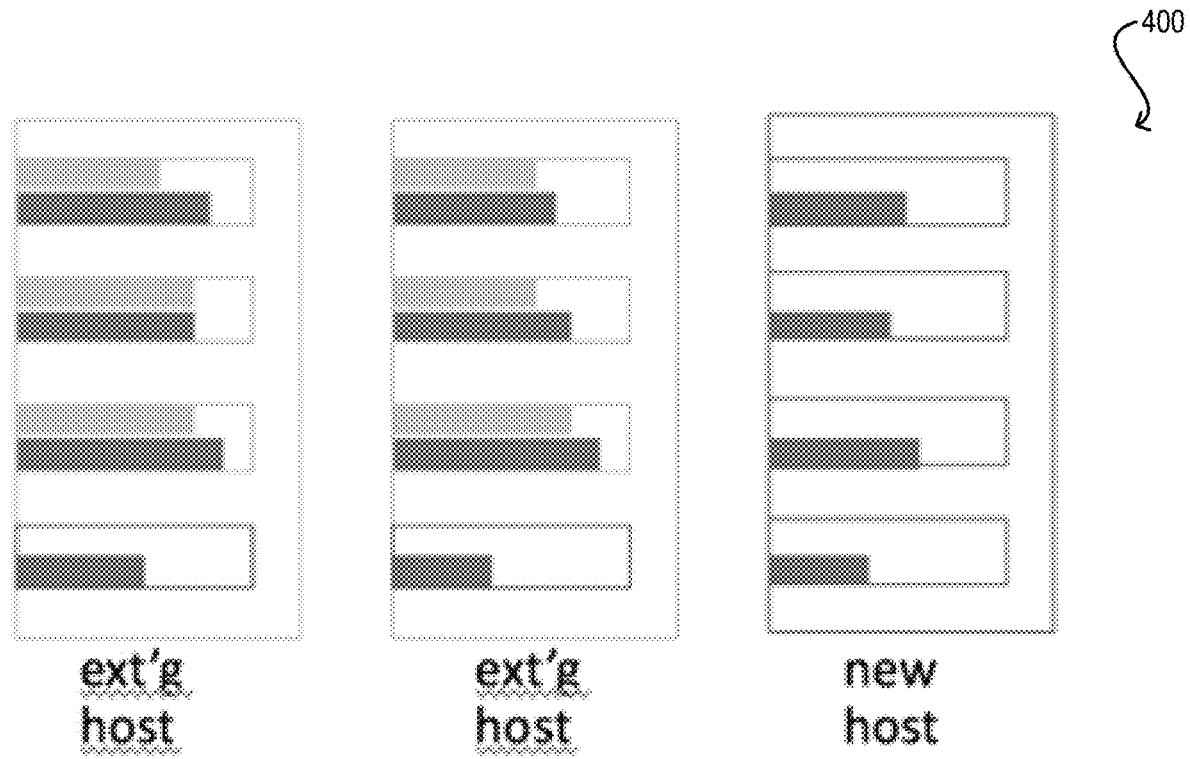
FIG. 4 depicts an example storage resource map that may be generated via the workflow of FIG. 3 according to certain embodiments.
Figure 4:
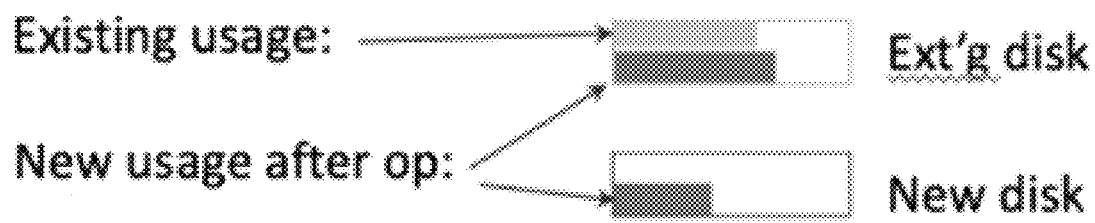

An example schematic diagram of the resource usage map noted above in shown in FIG. 4 as diagram 400.

It should be appreciated that workflow 300 of FIG. 3 is illustrative and various modifications are possible. For example, some types of storage management operations consist of a number of rolling sub-operations, such as evacuating the data from each disk or disk group from among a number of disks or disk groups. For these types of operations, each sub-operation can be performed sequentially and the state of the cloned resource database from the end of one sub-operation can be used as the baseline for the next sub-operation. Once all of the sub-operations have been completed, a single report can be generated based on the final state of the cloned resource database.

In addition, in certain embodiments some or all of the information included in the report generated at block 326 can be provided to a downstream component or engine (located either on the same host system as HCI operation predictor 116 or a different machine). In these embodiments, the downstream component/engine can analyze the provided information and trigger one or more automated actions based on its analysis. For example, if the predicted result status of the storage management operation is a success, the downstream component/engine can automatically initiate the actual execution of that operation on HCI deployment 100 or schedule its initiation. As another example, if the predicted result status of the storage management operation is a failure due to a lack of a certain storage resource, the downstream component/engine can automatically take one or more steps for making a sufficient amount of that storage resource available in HCI deployment 100, such as provisioning a new host or new disk. As yet another example, if the report indicates that the storage management operation will cause one or more objects to lose accessibility or fall out of compliance with their respective storage policies, the downstream component/engine can automatically signal an alert or escalation.

To further clarify the processing shown in workflow 300 of FIG. 3, consider an example scenario in which an HCI deployment includes three host systems H1, H2, and H3 comprising disks D1, D2, and D3 respectively. Assume that HCI operation predictor 116 receives a request to simulate the removal of host system H1 from the deployment. In addition, assume that the following table represents the cluster resource database of the deployment immediately prior to the simulation:

TABLE 1

| Host | Disk (Total capacity/free capacity) | Components stored on disk (component data size/parent object) | Per-object storage policies |
| --- | --- | --- | --- |
| H1 | D1 (90G/50G) | C1 (25G/O1) C2 (15G/O2) | O1: None O2: Each component must be stored on different host |
| H2 | D2 (60G/25G) | C3 (25G/O3) C4 (10G/O2) | O3: None O2: Each component must be stored on different host |
| H3 | D3 (100G/10G) | C5 (90G/O4) | O4: None |

In this scenario, HCI operation predictor 116 will first create a clone copy of the cluster resource database shown above (per block 304 of workflow 300) and identify objects O1 and O2 as being affected by the removal of host system H1 (per block 306 of workflow 300). Objects O1 and O2 are affected because disk D1 of H1 currently stores component C1 of O1 and component C2 of O2 but this disk will be brought offline.

HCI operation predictor 116 will then enter loop 308 of workflow 300 with respect to object O1 and determine an appropriate reconfiguration for O1—in other words, determine how the components of O1 should be moved in order to accommodate the removal of D1/H1 (per block 310 of workflow 300). Assume that the determined reconfiguration of O1 involves moving component C1 of O1 to host system H2. Per block 312 of workflow 300, HCI operation predictor 116 will check whether this is possible (i.e., whether host system H2 has sufficient free disk capacity to store C1) and because it is possible, HCI operation predictor 116 will update the cloned resource database to reduce the free capacity of disk D2 of H2 by 25 G, which is the data size of C1.

HCI operation predictor 116 will subsequently enter loop 308 of workflow 300 with respect to object O2 and determine an appropriate reconfiguration for O2. Assume that the determined reconfiguration of O2 involves moving component C2 of O2 to host system H3 (note that C2 cannot be moved to host system H2 because H2 already stores another component of O2 and thus this would be a violation of O2's storage policy). Per block 312 of workflow 300, HCI operation predictor 116 will check whether C2 can be moved to H3 and determine that it cannot because disk D3 of H2 only has 10 G of free space while C2 has a data size of 15 G. Thus, HCI operation predictor 116 will determine that additional capacity needs to be added to host system H3 (in the form of, e.g., a newly provisioned disk D4 with at least 15 GB of free space) and add this additional capacity as a new disk entry for H3 in the cloned resource database per block 318 of workflow 300. HCI operation predictor 116 will then recheck the reconfiguration of O2 in view of the updated database, determine that component C2 can now be moved to disk D4 of H3, and reduce the free capacity of D4 in the cloned resource database by the size of C2.

Finally, per block 326 of workflow 300, HCI operation predictor 116 will generate a report indicating that the simulated removal of H1 failed due to a lack of storage resources on host system H3 and will indicate that the addition of at least 15 G of capacity to H3 is needed for the operation to complete successfully.

4. Handling Deduplication

In some HCI deployments, deduplication is used to compress the data that is stored on the deployment and thereby optimize storage usage. In such deployments, the deduplication of a given piece of data occurs at the time the data is written to disk. However, because HCI operation predictor 116 does not write any data to disk (it only simulates data writes by manipulating storage usage values in the in-memory resource database), the predictor does not know how much storage space that piece of data will actually consume once deduplicated.

To account for this, in a deduplication-enabled deployment HCI operation predictor 116 can apply a static deduplication ratio to objects/components that are written during its simulation. In this way, predictor 116 can estimate the physical storage space that will be consumed by those objects/components post-deduplication. In a particular embodiment, this static deduplication ratio can be calculated at the start of the simulation by taking the average deduplication ratio of all data stored across the deployment and modifying this average deduplication ratio by some adjustment factor (e.g., 20%). This adjustment factor can be changed by the deployment's administrators as needed based on, e.g., the nature of the data in the deployment.

5. Processing Order of Affected Objects

When a storage management operation is actually executed in an HCI deployment, the objects affected by the operation are typically processed in a random order. Thus, in various embodiments HCI operation predictor 116 cannot ensure that its simulation will process objects in the exact same order as the actual operation. In most cases, this difference in object ordering will not make a difference to the operation outcome. However, there are certain edge cases in which some orderings will succeed and other orderings will fail.

Figure 5:
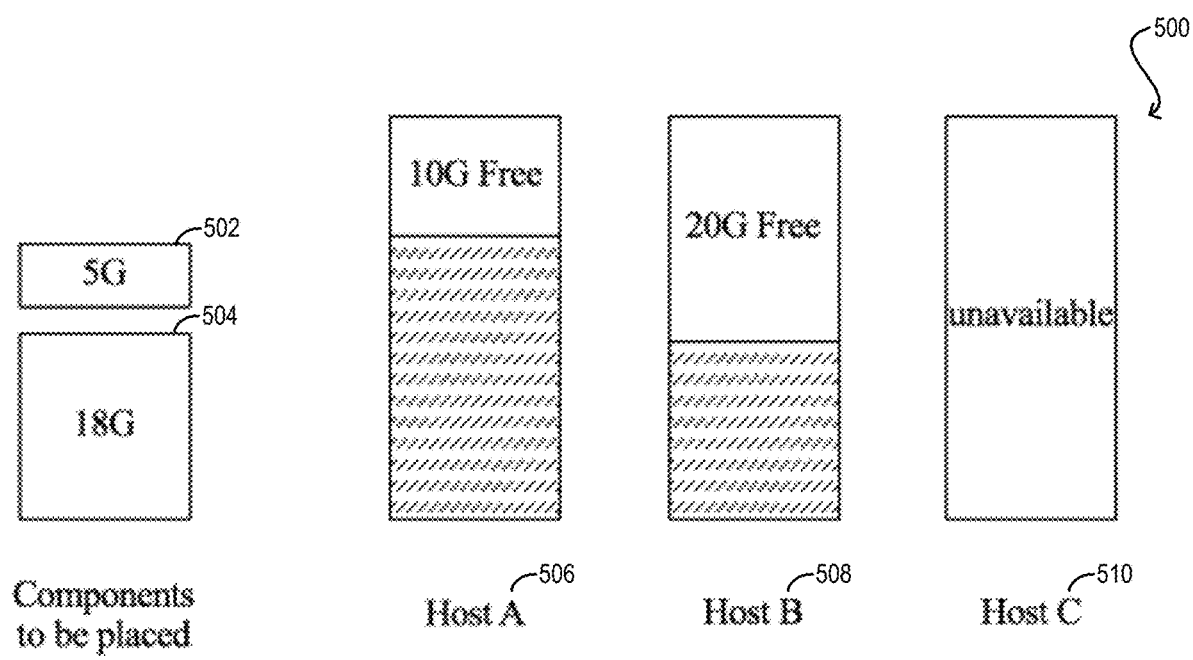
FIG. 5 depicts an example component placement scenario according to certain embodiments.

For example, FIG. 5 depicts a scenario 500 with two components 502 and 504 to be placed, with data sizes of 5 G (gigabytes) and 18 G respectively. There are two host systems A (506) and B (508) that meet the storage policy requirements associated with components 502 and 504; host system A has 10 GB of free space and host system B has 20 GB of free space. In addition, there is a third host system C (510) that does not meet the storage policy requirements associated with components 502 and 504 and thus cannot be used to host those components.

In scenario 500, there are three possible object orderings:
1. Component 504 is processed first—in this case, component 504 will be placed onto host system B and component 502 will be subsequently placed on host system A. This ordering is successful.
2. Component 502 is processed first and placed onto host system A—in this case, component 504 will be subsequently placed onto host system B. This ordering is successful.
3. Component 502 is processed first and placed onto host system B—in this case, there will only 15 GB free on host system B and 10 GB free on host system A after the placement of component 502. Thus, there is not enough storage space on either host for component 504, resulting in a failure.

To address this and other similar scenarios, in certain embodiments the objects that are affected by a given storage management operation can be sorted by size and processed in size order, both during the actual operation and during the simulation performed by HCI operation predictor 116. This ensures that the actual operation and the simulation will process the objects in the same order, and thus avoid discrepancies arising out of edge cases such as the once described with respect to FIG. 5.

In further embodiments, at the time of placing a component, the component can be placed on the disk with the largest available free space. This ensures, for example, that order (1) in the example above will occur, which is an optimal placement.

Certain embodiments described herein can employ various computer-implemented operations involving data stored in computer systems. For example, these operations can require physical manipulation of physical quantities—usually, though not necessarily, these quantities take the form of electrical or magnetic signals, where they (or representations of them) are capable of being stored, transferred, combined, compared, or otherwise manipulated. Such manipulations are often referred to in terms such as producing, identifying, determining, comparing, etc. Any operations described herein that form part of one or more embodiments can be useful machine operations.

Yet further, one or more embodiments can relate to a device or an apparatus for performing the foregoing operations. The apparatus can be specially constructed for specific required purposes, or it can be a general-purpose computer system selectively activated or configured by program code stored in the computer system. In particular, various general-purpose machines may be used with computer programs written in accordance with the teachings herein, or it may be more convenient to construct a more specialized apparatus to perform the required operations. The various embodiments described herein can be practiced with other computer system configurations including handheld devices, microprocessor systems, microprocessor-based or programmable consumer electronics, minicomputers, mainframe computers, and the like.

Yet further, one or more embodiments can be implemented as one or more computer programs or as one or more computer program modules embodied in one or more non-transitory computer readable storage media. The term non-transitory computer readable storage medium refers to any data storage device that can store data which can thereafter be input to a computer system. The non-transitory computer readable media may be based on any existing or subsequently developed technology for embodying computer programs in a manner that enables them to be read by a computer system. Examples of non-transitory computer readable media include a hard drive, network attached storage (NAS), read-only memory, random-access memory, flash-based nonvolatile memory (e.g., a flash memory card or a solid-state disk), a CD (Compact Disc) (e.g., CD-ROM, CD-R, CD-RW, etc.), a DVD (Digital Versatile Disc), a magnetic tape, and other optical and non-optical data storage devices. The non-transitory computer readable media can also be distributed over a network coupled computer system so that the computer readable code is stored and executed in a distributed fashion.

In addition, while certain virtualization methods referenced herein have generally assumed that virtual machines present interfaces consistent with a particular hardware system, persons of ordinary skill in the art will recognize that the methods referenced can be used in conjunction with virtualizations that do not correspond directly to any particular hardware system. Virtualization systems in accordance with the various embodiments, implemented as hosted embodiments, non-hosted embodiments or as embodiments that tend to blur distinctions between the two, are all envisioned. Furthermore, certain virtualization operations can be wholly or partially implemented in hardware.

Many variations, modifications, additions, and improvements are possible, regardless the degree of virtualization.

The virtualization software can therefore include components of a host, console, or guest operating system that performs virtualization functions. Plural instances can be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in exemplary configurations can be implemented as a combined structure or component. Similarly, structures and functionality presented as a single component can be implemented as separate components.

As used in the description herein and throughout the claims that follow, "a," "an," and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of particular embodiments may be implemented. These examples and embodiments should not be deemed to be the only embodiments, and are presented to illustrate the flexibility and advantages of particular embodiments as defined by the following claims. Other arrangements, embodiments, implementations and equivalents can be employed without departing from the scope hereof as defined by the claims.

What is claimed is:

1. A method for predicting an outcome of a storage management operation on a hyper-converged infrastructure (HCI) deployment, the method comprising:
    retrieving, by a computer system, a current storage resource state of the HCI deployment, wherein the HCI deployment comprises a plurality of host systems with locally-attached physical storage devices, wherein the locally-attached physical storage devices are aggregated into a virtual storage pool that is made available to virtual machines (VMs) running on the plurality of host systems for data storage, and wherein the current storage resource state includes a component layout and a storage policy for an object maintained in the virtual storage pool;
    executing, by the computer system, an in-memory simulation of the storage management operation in view of the current storage resource state, the executing including performing one or more simulated data movements of one or more components of the object between one or more of the plurality of host systems in accordance with the storage policy, wherein the one or more simulated data movements are performed in a system memory of the computer system and do not cause data to be physically moved between the one or more host systems, and wherein the one or more simulated data movements are configured to keep the object in compliance with the storage policy;
    as part of executing the in-memory simulation, determining, by the computer system, that at least one simulated data movement from a first host system to a second host system fails due to a lack of available storage space in a locally-attached physical storage device of the second host system; and
    generating, by the computer system, a report including a predicted result status of the storage management operation based on the in-memory simulation, wherein the predicted result status indicates that the storage management operation cannot be completed successfully because the at least one simulated data movement failed due to the lack of available storage space.

2. The method of claim 1 wherein the retrieving comprises:
    creating, in the system memory of the computer system, a cloned copy of a cluster resource database maintained by the HCI deployment.

3. The method of claim 1 wherein the current storage resource state further includes:
    a current number of the plurality of host systems in the HCI deployment;
    a current number of disks residing in each host system;
    a storage capacity of each disk; and
    a current usage level of each disk.

4. The method of claim 2 wherein executing the in-memory simulation comprises:
    determining, from the cloned copy of the cluster resource database, that the object is affected by the storage management operation;
    determining a reconfiguration for the object;
    if the reconfiguration can be successfully applied to the cloned copy, updating the cloned copy to reflect the reconfiguration; and
    if the reconfiguration cannot be successfully applied to the cloned copy, identifying a storage resource needed for the reconfiguration and adding an amount of the storage resource to the cloned copy.

5. The method of claim 1 wherein the report further includes an indication of an amount of additional storage capacity needed at the second host system in order for the storage management operation to be successful.

6. The method of claim 1 wherein the report further includes:
    a resource state map comparing a post-operation storage resource state of the HCI deployment with the current storage resource state; and
    an indication that the object will become inaccessible or non-compliant with the storage policy due to the storage management operation.

7. The method of claim 1 further comprising:
    triggering, by the computer system, one or more actions based on the predicted result status.

8. A non-transitory computer readable storage medium having stored thereon program code executable by a computer system, the program code embodying a method for predicting an outcome of a storage management operation on a hyper-converged infrastructure (HCI) deployment, the method comprising:
    retrieving a current storage resource state of the HCI deployment, wherein the HCI deployment comprises a plurality of host systems with locally-attached physical storage devices, wherein the locally-attached physical storage devices are aggregated into a virtual storage pool that is made available to virtual machines (VMs) running on the plurality of host systems for data storage, and wherein the current storage resource state includes a component layout and a storage policy for an object maintained in the virtual storage pool;
    executing an in-memory simulation of the storage management operation in view of the current storage resource state, the executing including performing one or more simulated data movements of one or more components of the object between one or more of the plurality of host systems in accordance with the storage policy, wherein the one or more simulated data movements are performed in a system memory of the computer system and do not cause data to be physically moved between the one or more host systems, and wherein the one or more simulated data movements are configured to keep the object in compliance with the storage policy;

as part of executing the in-memory simulation, determining that at least one simulated data movement from a first host system to a second host system fails due to a lack of available storage space in a locally-attached physical storage device of the second host system; and generating a report including a predicted result status of the storage management operation based on the in-memory simulation, wherein the predicted result status indicates that the storage management operation cannot be completed successfully because the at least one simulated data movement failed due to the lack of available storage space.

9. The non-transitory computer readable storage medium of claim 8 wherein the retrieving comprises:

creating, in the system memory of the computer system, a cloned copy of a cluster resource database maintained by the HCI deployment.

10. The non-transitory computer readable storage medium of claim 8 wherein the current storage resource state further includes:

a current number of the plurality of host systems in the HCI deployment;
a current number of disks residing in each host system;
a storage capacity of each disk; and
a current usage level of each disk.

11. The non-transitory computer readable storage medium of claim 9 wherein executing the in-memory simulation comprises:

determining, from the cloned copy of the cluster resource database, that the object is affected by the storage management operation;
determining a reconfiguration for the object;
if the reconfiguration can be successfully applied to the cloned copy, updating the cloned copy to reflect the reconfiguration; and
if the reconfiguration cannot be successfully applied to the cloned copy, identifying a storage resource needed for the reconfiguration and adding an amount of the storage resource to the cloned copy.

12. The non-transitory computer readable storage medium of claim 8 wherein the report further includes an indication of an amount of additional storage capacity needed at the second host system in order for the storage management operation to be successful.

13. The non-transitory computer readable storage medium of claim 8 wherein the report further includes:

a resource state map comparing a post-operation storage resource state of the HCI deployment with the current storage resource state; and
an indication that the object will become inaccessible or non-compliant with the storage policy due to the storage management operation.

14. The non-transitory computer readable storage medium of claim 8 wherein the method further comprises:

triggering one or more actions based on the predicted results status.

15. A computer system comprising:
a processor; and
a non-transitory computer readable medium having stored thereon program code that, when executed, causes the processor to:

retrieve a current storage resource state of a hyper-converged infrastructure (HCI) deployment, wherein the HCI deployment comprises a plurality of host systems with locally-attached physical storage devices, wherein the locally-attached physical storage devices are aggregated into a virtual storage pool that is made available to virtual machines (VMs) running on the plurality of host systems for data storage, and wherein the current storage resource state includes a component layout and a storage policy for an object maintained in the virtual storage pool;

execute an in-memory simulation of the storage management operation in view of the current storage resource state, the executing including performing one or more simulated data movements of one or more components of the object between one or more of the plurality of host systems in accordance with the storage policy, wherein the one or more simulated data movements are performed in a system memory of the computer system and do not cause data to be physically moved between the one or more host systems, and wherein the one or more simulated data movements are configured to keep the object in compliance with the storage policy;

as part of executing the in-memory simulation, determine that at least one simulated data movement from a first host system to a second host system fails due to a lack of available storage space in a locally-attached physical storage device of the second host system; and generate a report including a predicted result status of the storage management operation based on the in-memory simulation, wherein the predicted result status indicates that the storage management operation cannot be completed successfully because the at least one simulated data movement failed due to the lack of available storage space.

16. The computer system of claim 15 wherein the code that causes the processor to retrieve the current storage resource state comprises code that causes the processor to:

create, in the system memory of the computer system, a cloned copy of a cluster resource database maintained by the HCI deployment.

17. The computer system of claim 15 wherein the current storage resource state further includes:

a current number of the plurality of host systems in the HCI deployment;
a current number of disks residing in each host system;
a storage capacity of each disk; and
a current usage level of each disk.

18. The computer system of claim 16 wherein the code that causes the processor to execute the in-memory simulation comprises code that causes the processor to:

determine, from the cloned copy of the cluster resource database, that the object is affected by the storage management operation;
determine a reconfiguration for the object;
if the reconfiguration can be successfully applied to the cloned copy, update the cloned copy to reflect the reconfiguration; and
if the reconfiguration cannot be successfully applied to the cloned copy, identify a storage resource needed for the reconfiguration and add an amount of the storage resource to the cloned copy.

19. The computer system of claim 15 wherein the report further includes an indication of an amount of additional storage capacity needed at the second host system in order for the storage management operation to be successful.

20. The computer system of claim 15 wherein the report further includes:
- a resource state map comparing a post-operation storage resource state of the HCI deployment with the current storage resource state; and
- an indication that the storage object will become inaccessible or non-compliant with the storage policy due to the storage management operation.

21. The computer system of claim 15 wherein the program code further causes the processor to:
- trigger one or more actions based on the predicted result status.

* * * * *